(12) United States Patent
Lee

(10) Patent No.: US 9,190,857 B1
(45) Date of Patent: Nov. 17, 2015

(54) SOLAR CHARGER FOR A PORTABLE ELECTRONIC DEVICE

(71) Applicant: David M. Lee, Westminster, CA (US)

(72) Inventor: David M. Lee, Westminster, CA (US)

(*) Notice: Subject to any disclaimer, the term of this patent is extended or adjusted under 35 U.S.C. 154(b) by 152 days.

(21) Appl. No.: 14/070,528

(22) Filed: Nov. 2, 2013

Related U.S. Application Data

(60) Provisional application No. 61/723,776, filed on Nov. 7, 2012.

(51) Int. Cl.
*H02J 7/00* (2006.01)

(52) U.S. Cl.
CPC ................... *H02J 7/0042* (2013.01)

(58) Field of Classification Search
CPC .................................................. H02J 7/0065
USPC ............................................................ 320/101
See application file for complete search history.

(56) References Cited

U.S. PATENT DOCUMENTS

| | | | |
|---|---|---|---|
| 4,293,808 A * | 10/1981 | Varadi et al. ................... | 320/101 |
| 5,007,728 A | 4/1991 | Magorien | |
| 5,522,943 A | 6/1996 | Spencer | |
| 5,793,184 A * | 8/1998 | O'Connor ..................... | 320/101 |
| 6,130,465 A * | 10/2000 | Cole .............................. | 257/431 |
| 7,059,717 B2 | 6/2006 | Bloch | |
| 7,585,070 B2 | 9/2009 | Hou | |
| 8,169,185 B2 * | 5/2012 | Partovi et al. ................. | 320/108 |
| 8,297,749 B2 | 10/2012 | Chen | |
| 8,317,318 B2 | 11/2012 | Silver | |
| 8,366,267 B2 | 2/2013 | Lin | |
| 8,629,654 B2 * | 1/2014 | Partovi et al. ................. | 320/108 |
| 8,947,047 B2 * | 2/2015 | Partovi et al. ................. | 320/108 |
| 2006/0012331 A1 | 1/2006 | Gillette | |
| 2007/0222410 A1 | 9/2007 | Lee | |
| 2008/0013040 A1 | 1/2008 | Anderl | |
| 2008/0125188 A1 | 5/2008 | Huang | |
| 2009/0096413 A1* | 4/2009 | Partovi et al. ................. | 320/108 |
| 2009/0160396 A1 | 6/2009 | Shyu | |
| 2010/0108120 A1 | 5/2010 | Lin | |
| 2012/0169989 A1 | 7/2012 | Lin | |
| 2012/0224135 A1 | 9/2012 | Moritz | |
| 2013/0193905 A1 | 8/2013 | Wilson | |

FOREIGN PATENT DOCUMENTS

CN           100592141         2/2010

* cited by examiner

*Primary Examiner* — Sun Lin
(74) *Attorney, Agent, or Firm* — Quick Patents; Kevin Prince

(57) ABSTRACT

A charging device for charging a portable electronic device having a charging port has at least one solar cell array having a top side adapted for converting light energy into an electrical energy. The solar cell array is sized similarly to a paper currency and has a bisector fold line between a first side and a second side along which the solar cell array can be folded and stored within a wallet without damage. A voltage regulator converts the electrical energy from the solar cell array into a DC power within a preset voltage range and providing the DC power on an output connector plug. At least one auxiliary plug adapter can be further included, each having a socket adapted for an electrical connection with the output connector plug of the voltage regulator and a unique charging plug for electrically connecting with the portable electronic device.

18 Claims, 5 Drawing Sheets

SOLAR CHARGER FOR A PORTABLE ELECTRONIC DEVICE

CROSS-REFERENCE TO RELATED APPLICATIONS

This application claims the benefit of U.S. Provisional Patent Application 61/723,776, filed on Nov. 7, 2012, and incorporated herein by reference.

STATEMENT REGARDING FEDERALLY SPONSORED RESEARCH AND DEVELOPMENT

Not Applicable.

FIELD OF THE INVENTION

This invention relates to portable electronics chargers, and more particularly to a solar power-based charger.

DISCUSSION OF RELATED ART

Quite often cell phones need charging at inopportune times or at inconvenient locations. Current cell phone wall chargers are not convenient to carry and a power source for such chargers is not always available. In these situations a portable charger offers a more practical method to charge a cell phone.

A solar powered charger offers an opportunity to utilize an existing light source to power the charger. Current solar powered cell phone chargers on the market today are big and bulky and not convenient to carry. For example, US Patent Application 2006/0012331 to Gillette, II, on Jan. 19, 2006 teaches a relatively large solar panel charger built into a compartment of a briefcase or laptop carrying case. Such a product requires use of something the size of the briefcase or carrying case to use, and cannot be easily carried on one's person.

US Patent Application 2009/0160396 to Shyu et al. on Jun. 25, 2009 teaches a charging device for recharging portable phones and the like. While multiple solar cells can be arranged in such a device between hinges, each solar cell is rigid and is therefore not comfortable for keeping in a pants pocket, for example, or suitable for carrying in a person's wallet. US Patent Application 2011/0291607 to Rossi et al. on Dec. 1, 2011 is also not conveniently sized for personal carrying of the device without the use of a briefcase, carrying case, or purse.

US Patent Application 2007/0017566 to Gaudiana et al. on Jan. 25, 2007 teaches a flexible photovoltaic module that could be sized to fit within a conventional wallet. However, such a device is not adapted for charging one of a plurality of different portable electronic devices through varying recharging ports and that may require a different voltage than output by such a device.

Therefore, there is a need for a charging device that is adapted to recharge a portable electronic device, such as a cellular phone, that can also be conveniently stored and transported within a conventional wallet without being damaged. Such a needed device would provide for the charging of multiple devices with varying recharging ports. Further, such a device would be adaptable to devices having different power requirements through utilizing one or more hinged or folded solar cell arrays. The present invention accomplishes these objectives.

SUMMARY OF THE INVENTION

The present invention is a charging device for charging a portable electronic device having a charging port. Such a portable electronic device may be a cellular phone, tablet computer, or the like.

A solar cell array has a top side, a bottom side, a first end, a second end, a first side and a second side. The top side of the solar cell array is adapted for converting light energy into electrical energy. The solar cell array is sized similarly to a paper currency, such as a US dollar bill, and has a bisector fold line between the first and second sides along which the solar cell array may be folded without damaging the solar cell array.

A voltage regulator is adapted for converting the electrical energy from the solar cell array into DC power within a preset voltage range, such as between 4.5V and 5.5V DC, and providing the DC power on an output connector plug, such as a micro-USB plug. Preferably at least one auxiliary plug adapter is further included, each having a socket adapted for electrical connection with the output connector plug of the voltage regulator and a unique charging plug for electrically connecting with the portable electronic device.

In one embodiment, the charging device comprises a plurality of solar cell arrays each mutually electrically connected with the flexible conductors and either foldable at a second bisector fold line or hinged with hinges. In this manner, any number of solar cell arrays may be daisy-chained together, electrically either in series or in parallel as needed based on the voltage requirements of the voltage regulator or the portable electronic device, and mechanically with a plurality of the second bisector fold lines or hinges.

In use, the solar cell array may be stored and folded within a conventional wallet, or removed with the output connector plug electrically engaged with the charging port of the portable electronic device to charge the portable electronic device.

The present invention is a charging device for a portable electronic device, such as a cellular phone, that can also be conveniently stored and transported within a conventional wallet without being damaged. The present invention provides for the charging of multiple devices with varying recharging ports. Further, the present device is adaptable to devices having different power requirements through the use of one or more hinged or folded solar cell arrays. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figures 1A, 1B, 2:
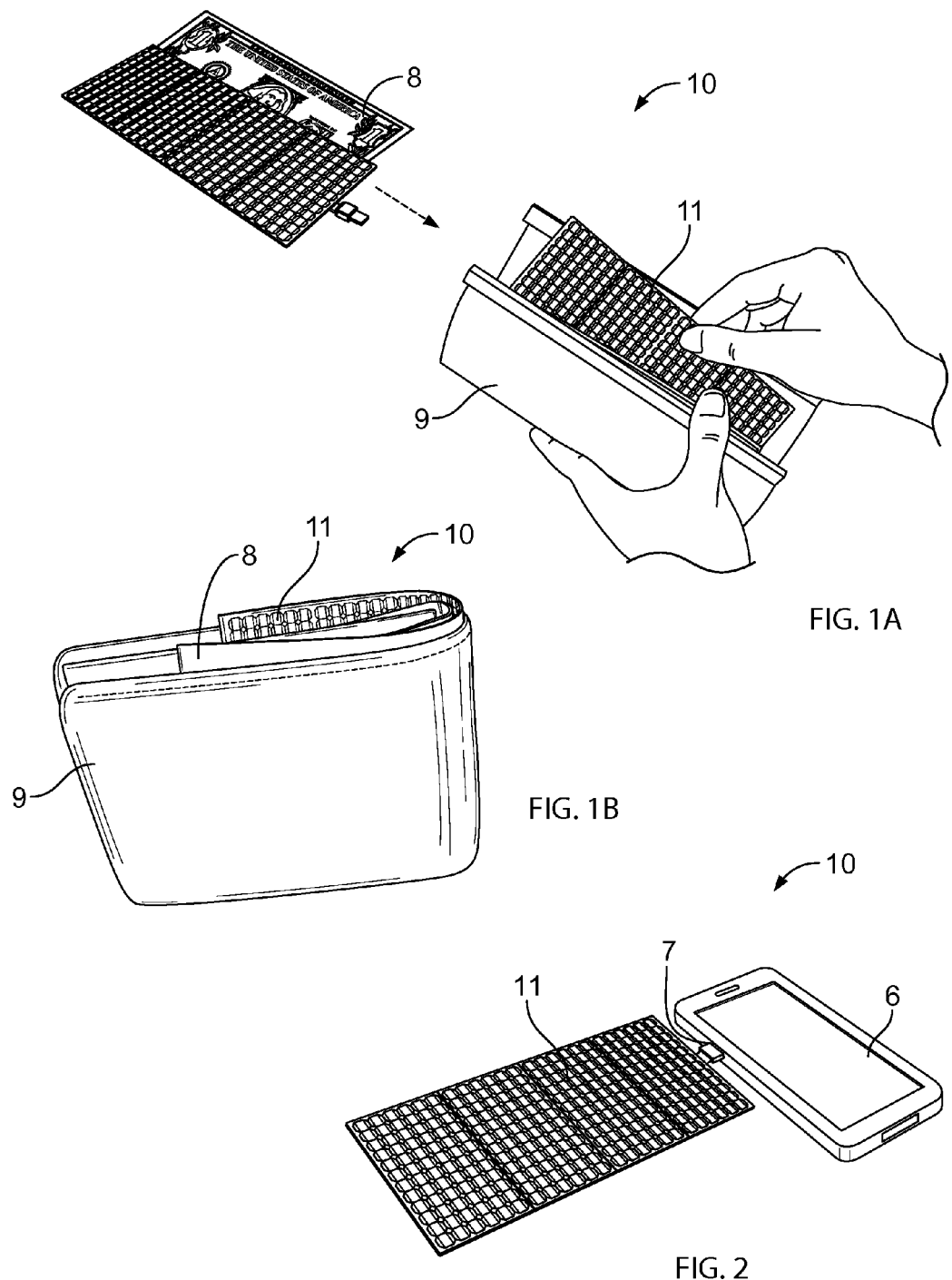
FIG. 1A is a perspective exploded view of the invention as stored and transported within a wallet.
FIG. 1B is a perspective view of an alternate wallet, showing the invention in a folded configuration.
FIG. 2 is a perspective view of the invention shown as used to charge a portable electronic device.

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word:

FIGS. 1A-4B illustrate a charging device 10 for charging a portable electronic device 6 having a charging port 7. Such a portable electronic device 6 may be a cellular phone, tablet computer, or the like.

A solar cell array 11 has a top side 12, a bottom side 13, a first end 14, a second end 15, a first side 16 and a second side 17. The top side 12 of the solar cell array 11 is adapted for converting light energy into electrical energy. The solar cell array 11 is sized similarly to a paper currency 8, such as a US dollar bill, and has a bisector fold line 50 between the first and second sides 16, 17 along which the solar cell array 11 may be folded without damaging the solar cell array 11.

Figure 3A:
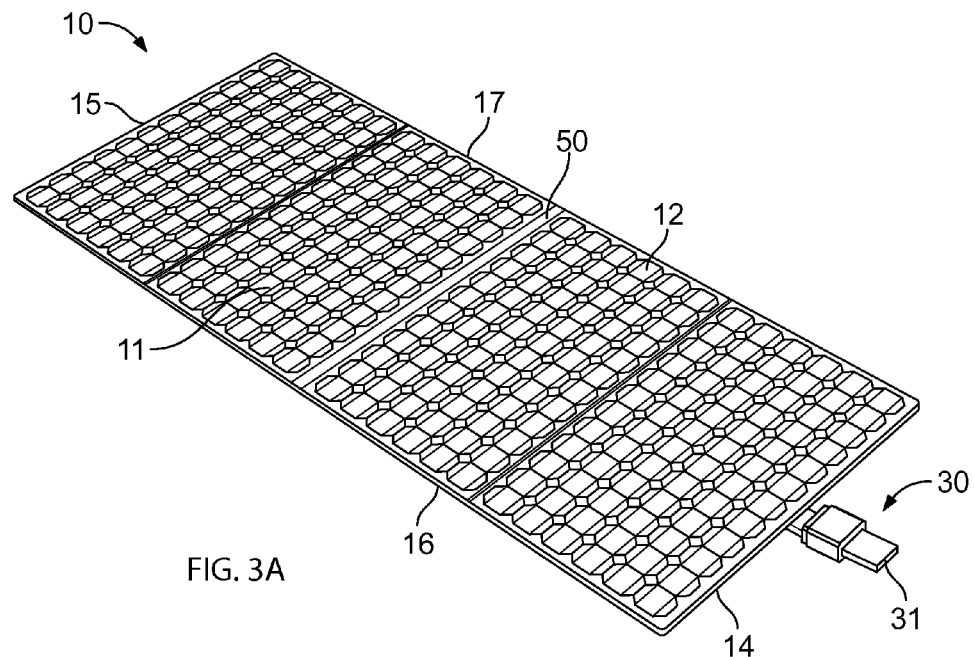
FIG. 3A is an enlarged perspective view of an embodiment having a single solar cell array.
Figure 3B:
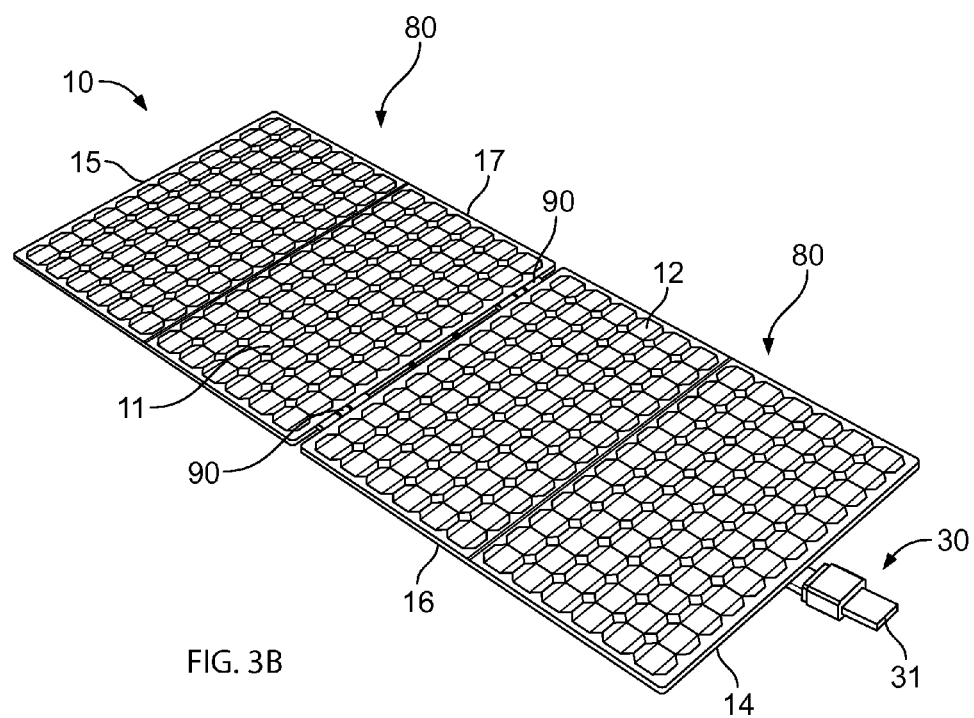
FIG. 3B is an enlarged perspective view of an embodiment wherein the solar cell array is separated into two halves hinged at a bisector fold line.
Figure 4A:
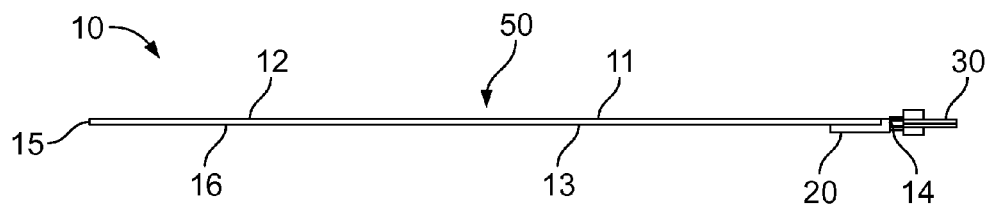
FIG. 4A is a side elevational view of FIG. 3A.
Figure 4B:
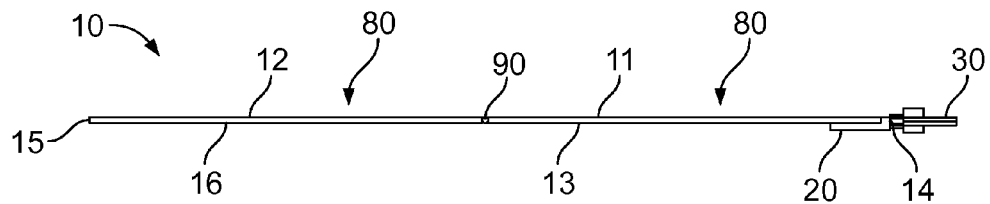
FIG. 4B is a side elevational view of FIG. 3B.
Figure 6A:
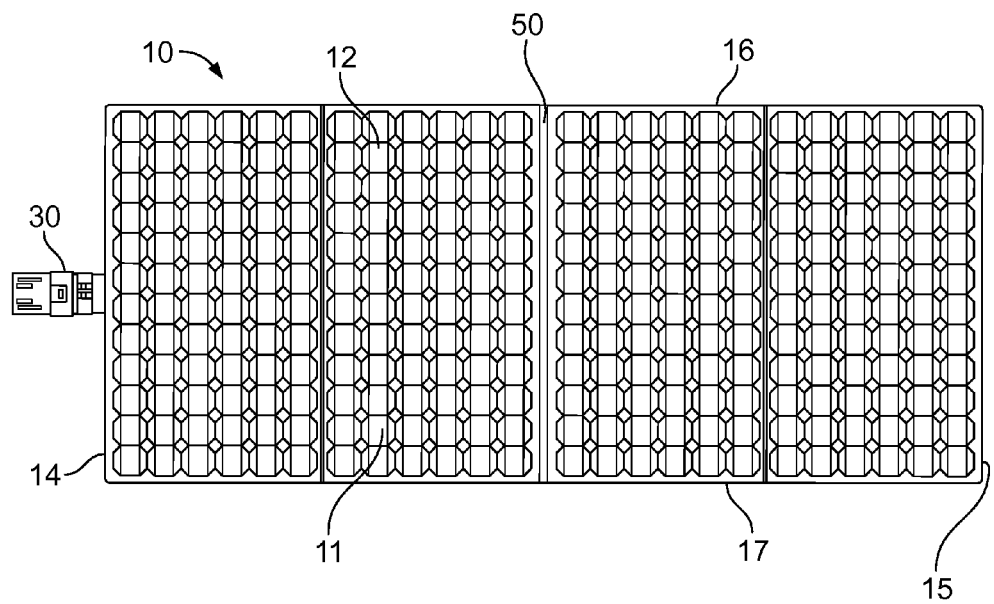
FIG. 6A is a top plan view of FIG. 3A.
Figure 6B:
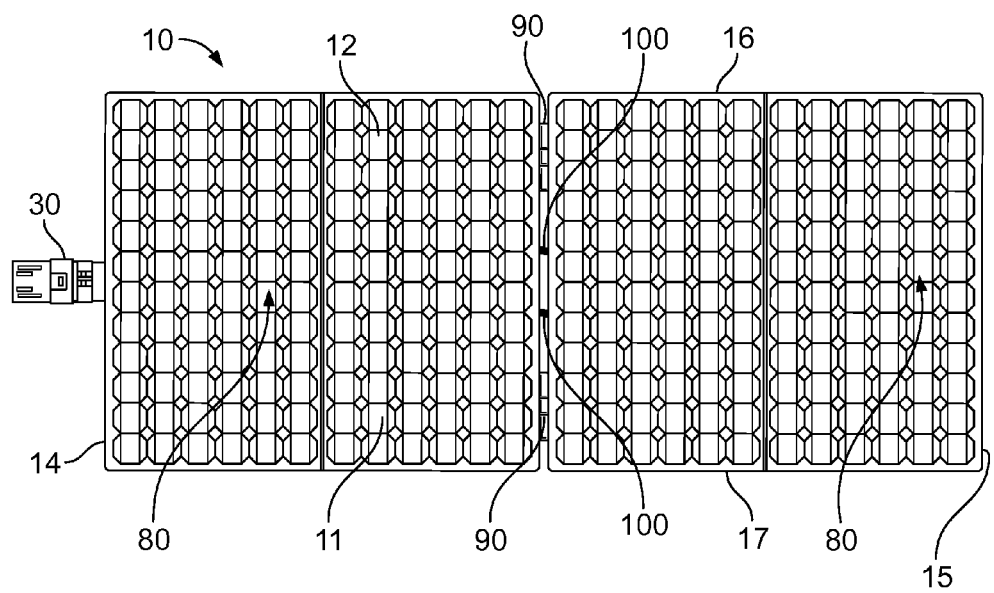
FIG. 6B is a top plan view of FIG. 3B.

The solar cell array 11 is preferably made from a flexible or resilient material, and may be a single foldable piece (FIGS. 3A, 4A and 6A). Alternately, the solar cell array 11 may be made from a rigid material and separated into two halves 80 that are hinged at the bisector fold line 50 with at least one hinge 90 (FIGS. 3B, 4B and 6B). Each half 80 of the solar cell array 11, in such an embodiment, is electrically mutually connected with a plurality of flexible conductors 100, such as flexible PCBs, connectors, or wires.

Figure 5:
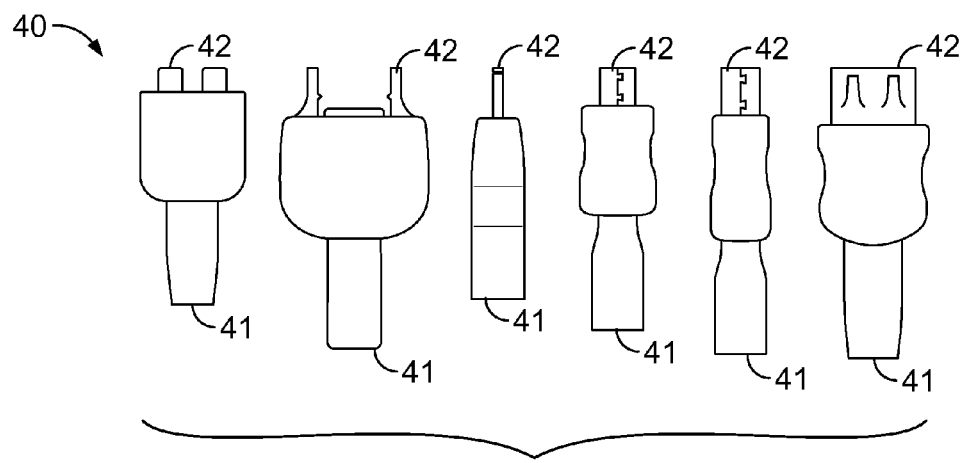
FIG. 5 is a top plan view of a plurality of auxiliary plug adapters for adapting the invention to a variety of portable electronic devices.

A voltage regulator 20 is adapted for converting the electrical energy from the solar cell array 11 into DC power within a preset voltage range, such as between 4.5V and 5.5V DC, and providing the DC power on an output connector plug 30, such as a micro-USB plug 31 (FIG. 3A). Preferably at least one auxiliary plug adapter 40 (FIG. 5) is further included, each having a socket 41 adapted for electrical connection with the output connector plug 30, such as the micro-USB plug 31, of the voltage regulator 20 and a unique charging plug 42 for electrically connecting with the portable electronic device 6.

Figure 7:
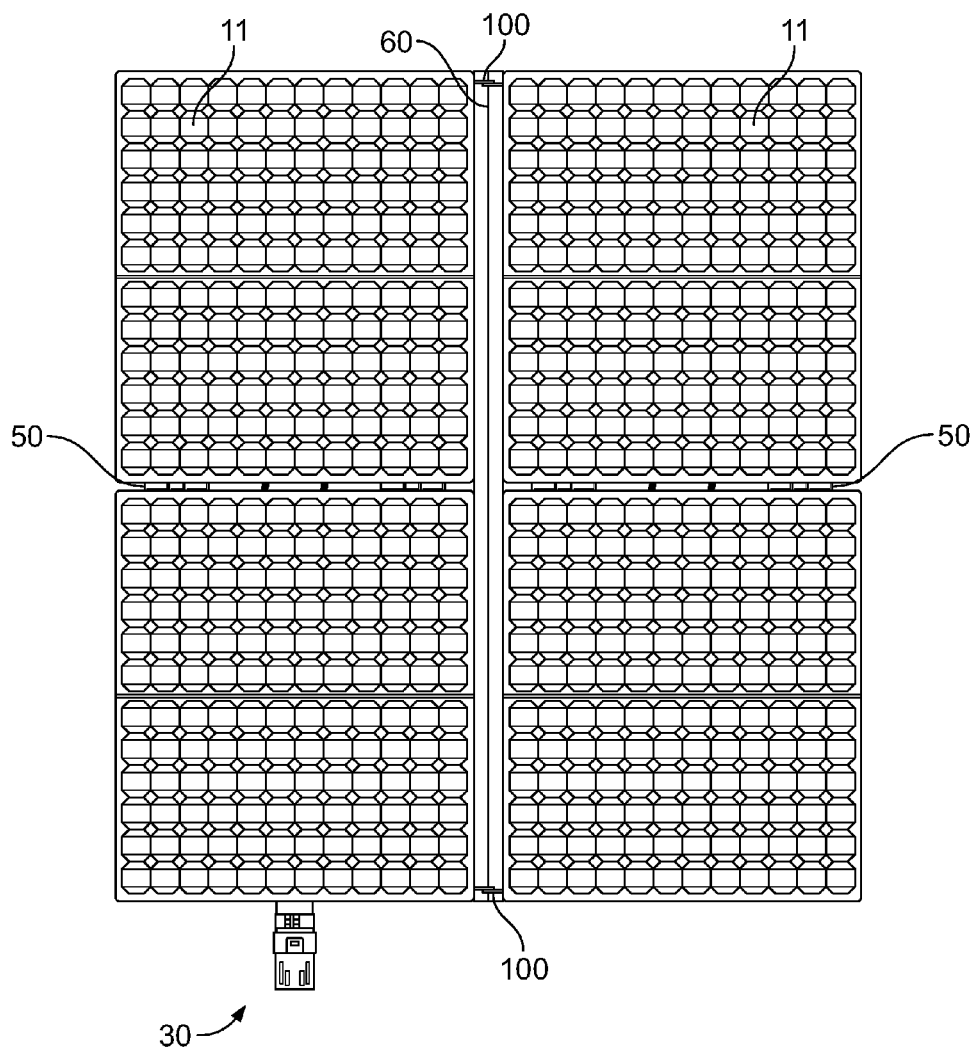
FIG. 7 is a top plan view of an embodiment having a plurality of hinged solar cell arrays.

In one embodiment, the charging device comprises a plurality of solar cell arrays each mutually electrically connected with the flexible conductors 100 and either foldable at a second bisector fold line 60 (FIG. 7) or hinged with hinges 90 (not shown). In this manner, any number of solar cell arrays 11 may be daisy-chained together, electrically either in series or in parallel as needed based on the voltage requirements of the voltage regulator 20 or the portable electronic device 6, and mechanically with a plurality of the second bisector fold lines 60 or hinges 90.

In use, the solar cell array 11 may be stored and folded within a conventional wallet 9 (FIGS. 1A and 1B), or removed with the output connector plug 30 electrically engaged with the charging port 7 of the portable electronic device 6 to charge the portable electronic device 6 (FIG. 2).

While a particular form of the invention has been illustrated and described, it will be apparent that various modifications can be made without departing from the spirit and scope of the invention. For example, while the corners of the solar cell array 11 are shown as sharp nearly 90-degree corners, such corners could be rounded without departing from the spirit of the invention. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A charging device for a portable electronic device having a charging port, comprising:
   a solar cell array having a top side, a bottom side, a first end, a second end, a first side, and a second side, the top side of the solar cell array adapted for converting light energy into an electrical energy, the solar cell array and being sized similarly to a paper currency and having a bisector fold line between the a first side and a second side along which the solar cell array can be folded without damaging the solar cell array; and
   a voltage regulator adapted for converting the electrical energy from the solar cell array into a DC power within a preset voltage range and providing the DC power on an output connector plug;
   whereby the solar cell array can be stored and folded within a conventional wallet, or removed with the output connector plug being electrically engaged with the charging port of the portable electronic device to charge the portable electronic device.

2. The charging device of claim 1 wherein the output connector plug is a micro-USB plug.

3. The charging device of claim 2 further including at least one auxiliary plug adapter each having a socket adapted for an electrical connection with the micro-USB output connector plug of the voltage regulator and a unique charging plug for electrically connecting with the portable electronic device.

4. The charging device of claim 1 further including at least one auxiliary plug adapter each having a socket adapted for an electrical connection with the output connector plug of the voltage regulator and a unique charging plug for electrically connecting with the portable electronic device.

5. The charging device of claim 1 wherein the solar cell array is sized similar to a United States paper currency.

6. The charging device of claim 1 wherein the preset voltage range of the voltage regulator is between 4.5V and 5.5V DC.

7. The charging device of claim 1 wherein the solar cell array is made from a flexible material.

8. The charging device of claim 1 wherein the solar cell array is made from a resilient material.

9. The charging device of claim 1 wherein the solar cell array is made from a rigid material and is separated into two halves hinged at the bisector fold line, each half of the solar cell array being electrically mutually connected with a plurality of flexible conductors.

10. A charging device for a portable electronic device having a charging port, comprising:
    a plurality of solar cell arrays each solar cell array having a top side, a bottom side, a first end, a second end, a first side, and a second side, the top side of each solar cell array adapted for converting light energy into an electrical energy, each solar cell array being sized similarly to a paper currency and having a first bisector fold line between the first side and the second side along which each solar cell array can be folded without damaging said each solar cell array, the plurality of solar cell arrays each mutually connected and having a second bisector fold line between the first end and the second ends along which each solar cell array can be folded so that the plurality of solar cell arrays together are sized similar to the paper currency, each solar cell array mutually connected with a plurality of flexible conductors; and
    a voltage regulator adapted for converting the electrical energy from the solar cell arrays into a DC power within a preset voltage range and providing the DC power on an output connector plug;
    whereby the solar cell arrays can be stored and folded within a conventional wallet, or removed with the output connector plug being electrically engaged with the charging port of the portable electronic device to charge the portable electronic device.

11. The charging device of claim 10 wherein the output connector plug is a micro-USB plug.

12. The charging device of claim 11 further including at least one auxiliary plug adapter each having a socket adapted for an electrical connection with the micro-USB output connector plug of the voltage regulator and a unique charging plug for electrically connecting with the portable electronic device.

13. The charging device of claim 10 further including at least one auxiliary plug adapter each having a socket adapted for an electrical connection with the output connector plug of the voltage regulator and a unique charging plug for electrically connecting with the portable electronic device.

14. The charging device of claim 10 wherein each solar cell array is sized similar to a United States paper currency.

15. The charging device of claim 10 wherein the preset voltage range of the voltage regulator is between 4.5V and 5.5V DC.

16. The charging device of claim 10 wherein each solar cell array is made from a flexible material.

17. The charging device of claim 10 wherein each solar cell array is made from a resilient material.

18. The charging device of claim 10 wherein each solar cell array is made from a rigid material and is separated into two halves, all mutually hinged at the first bisector fold line and the second bisector fold line, each half of each solar cell array being electrically mutually connected with a plurality of flexible conductors.

* * * * *